United States Patent [19]
Tsang et al.

[11] Patent Number: 5,358,891
[45] Date of Patent: Oct. 25, 1994

[54] TRENCH ISOLATION WITH PLANAR TOPOGRAPHY AND METHOD OF FABRICATION

[75] Inventors: Chi-Hwa Tsang, Aloha; Kerry L. Spurgin, Hillsboro; Deborah A. Parsons, Portland; William L. Hargrove, Sherwood; Ganesan Radhakrishnan, Hillsboro, all of Oreg.

[73] Assignee: Intel Corporation, Santa Clara, Calif.

[21] Appl. No.: 84,795

[22] Filed: Jun. 29, 1993

[51] Int. Cl.$^5$ .............................................. H01L 21/76
[52] U.S. Cl. .................................... 437/67; 437/62; 437/63; 437/64; 148/DIG. 50
[58] Field of Search ................ 437/67, 62, 63, 64; 148/DIG. 50

[56] References Cited

U.S. PATENT DOCUMENTS

| | | | |
|---|---|---|---|
| 4,213,818 | 7/1980 | Lemons et al. | 156/643 |
| 4,631,803 | 12/1986 | Hunter et al. | 437/67 |
| 4,662,977 | 5/1987 | Motley et al. | 156/643 |
| 4,666,556 | 5/1987 | Fulton et al. | 148/DIG. 50 |
| 4,853,344 | 8/1989 | Darmawan | 437/67 |
| 4,876,214 | 10/1989 | Yamaguchi et al. | 437/67 |
| 4,965,217 | 10/1990 | Desilets et al. | 148/DIG. 50 |
| 5,118,384 | 6/1992 | Harmon et al. | 156/662 |

FOREIGN PATENT DOCUMENTS

| | | | |
|---|---|---|---|
| 0073737 | 4/1987 | Japan | 437/67 |
| 0305527 | 12/1988 | Japan | 437/67 |
| 0235245 | 9/1989 | Japan | 437/67 |

Primary Examiner—Tom Thomas
Assistant Examiner—Trung Dang
Attorney, Agent, or Firm—Blakely, Sokoloff, Taylor & Zafman

[57] ABSTRACT

A method of forming and refilling a trench in a substrate. First a trench is formed in the substrate. The trench is then refilled with a conformal material. Next, a recess is etched into the top portion of the refilled trench. The recess is then refilled with a second material until the refilled recess and substrate are substantially planar.

15 Claims, 7 Drawing Sheets

TRENCH ISOLATION WITH PLANAR TOPOGRAPHY AND METHOD OF FABRICATION

BACKGROUND OF THE INVENTION

1. FIELD OF THE INVENTION

The present invention relates to the field of semiconductor integrated circuit manufacturing, and, more specifically, to a method of forming a planar and reliable trench isolation region in a semiconductor substrate.

2. DESCRIPTION OF RELEVANT ART

Deep and narrow trench isolation structures are presently used in integrated circuit manufacturing. Deep trench isolation structures can be used to isolate n-channel and p-channel devices in CMOS circuits. Additionally, trench isolation structures can be used to isolate transistors of bipolar circuits. Deep trench isolation structures are useful because they provide isolation while only using limited substrate area. Small dimensioned isolation regions will be needed in future ultra large scale integrated (ULSI) circuits which will require high packing density of electronic devices. Despite its many advantages, deep trench isolation technology has been hindered by fabrication complexity and reliability considerations.

Figure 1A:
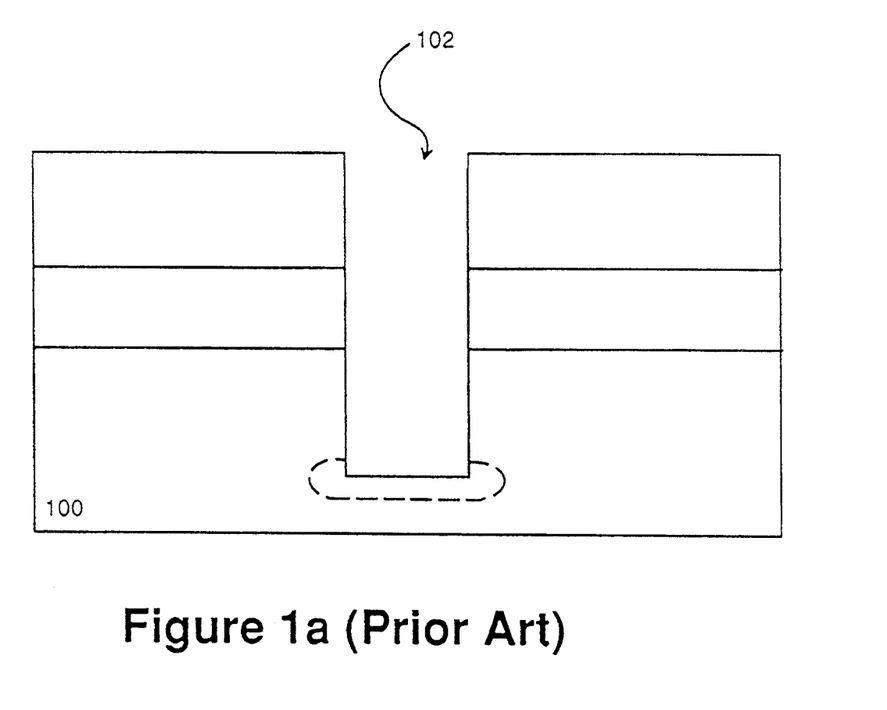
FIG. 1a is an illustration of a cross-sectional view showing the formation of a trench in a silicon substrate.
Figure 1B:
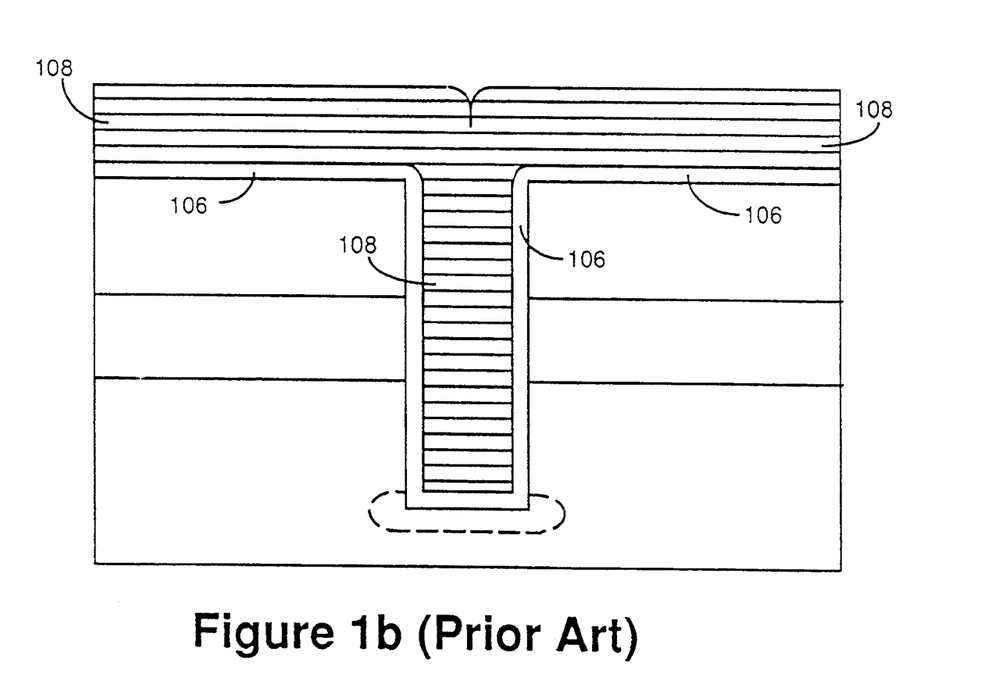
Figure 1C:
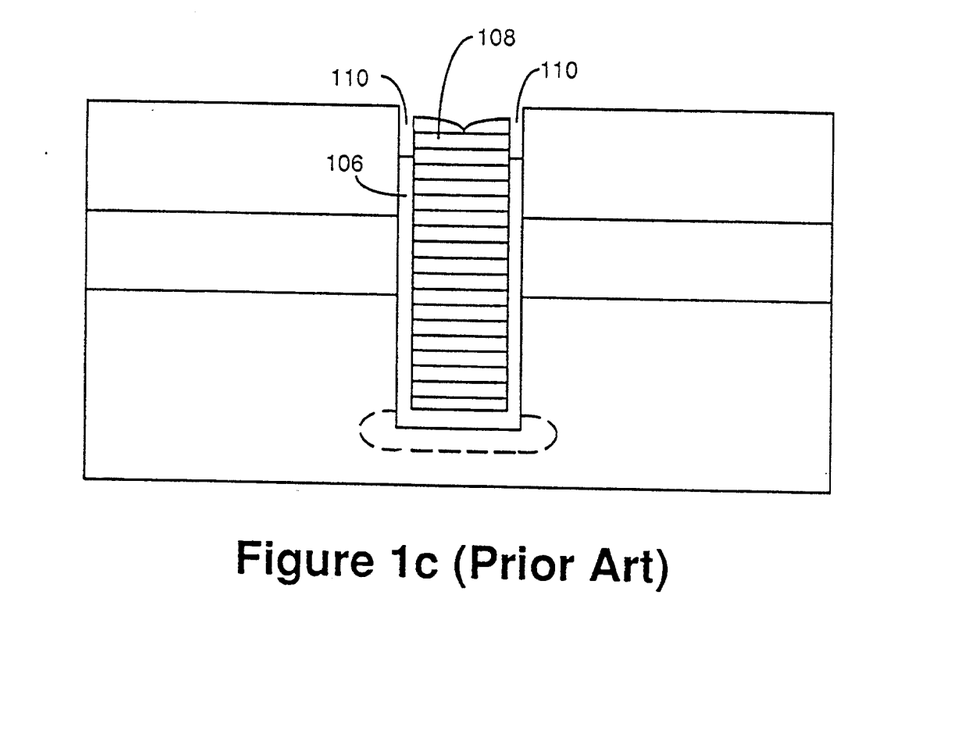
FIG. 1c is an illustration of a cross-sectional view showing the removal of the trench oxide and polysilicon layer from the surface of the substrate of FIG. 1b.

For example, FIGS. 1a–1f detail a prior art method of forming a deep trench isolation structure in a bipolar circuit. First, as shown in FIG. 1a, well-known process steps are used to etch a deep trench 102 into a substrate 100 for bipolar transistors. Next, as shown in FIG. 1b, a trench oxide 106 is grown on the surface of substrate 100 and in trench 102 (i.e. on the sidewalls and on the bottom of trench 102). Next, an amorphous silicon or polysilicon layer 108 is formed on the trench oxide layer. The polysilicon layer is deposited until it completely refills trench 102. Next, as shown in FIG. 1c, polysilicon layer 108 on the surface of substrate 100 is etched back. The polysilicon etch-back process slightly recesses polysilicon refill 108 into trench 102. Next, trench oxide 106 on substrate 100 is removed. Unfortunately, the trench oxide strip step removes some of the trench oxide 106 along the sidewalls of trench 102, thereby forming gaps 110 between substrate 100 and polysilicon refill 108. Trench oxide gaps 110 cause downstream process problems.

Figure 1D:
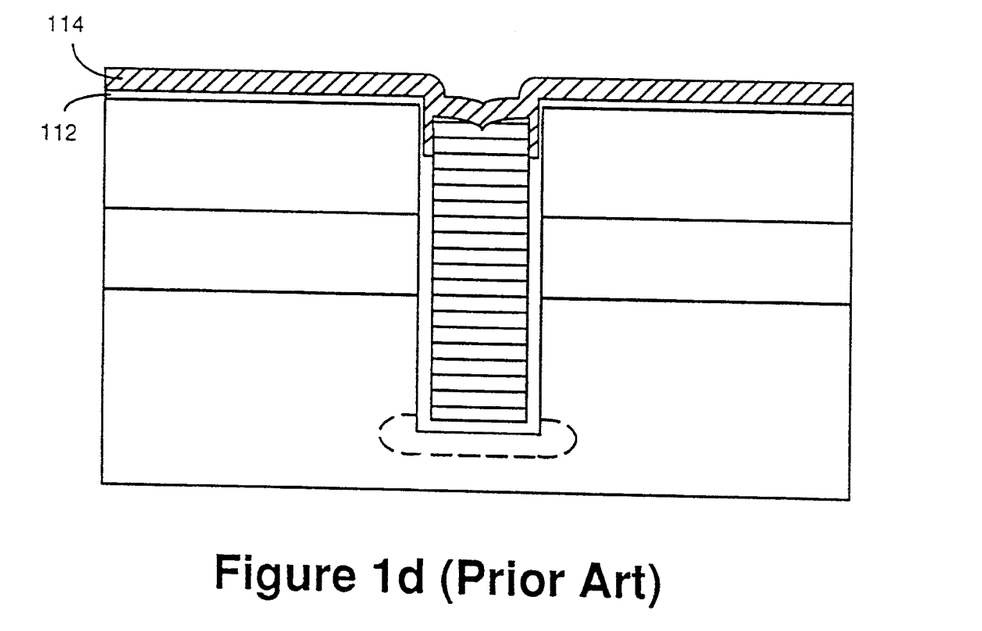
FIG. 1d is an illustration of a cross-sectional view showing the formation of a pad oxide layer and a silicon nitride layer on the substrate of FIG. 1c.
Figure 1E:
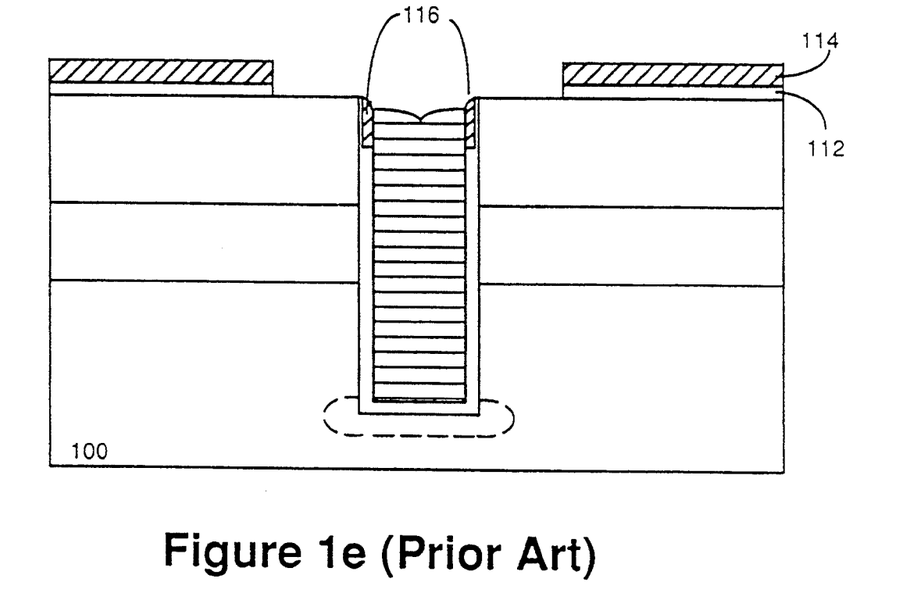
FIG. 1e is an illustration of a cross-sectional view showing the patterning of the silicon-nitride layer and the pad oxide layer on the substrate of FIG. 1d.
Figure 1F:
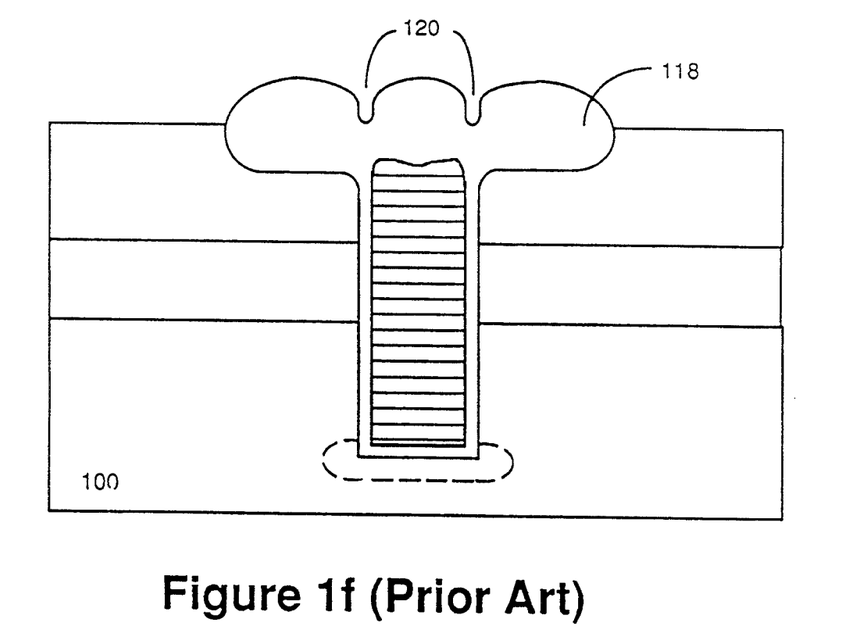
FIG. 1f is an illustration of a cross-sectional view showing the formation of a field oxide on the substrate of FIG. 1e wherein the field oxide is characterized by deep grooves and a non-planar topography.

Typically a thin pad-oxide layer 112 and a silicon nitride layer 114 are generally formed next on substrate 100 as shown in FIG. 1d. It is to be appreciated that pad-oxide 112 and silicon nitride 114 form in trench oxide gaps 110. Next, pad oxide 112 and silicon nitride 114 are patterned to open a window for a subsequent field oxidation. Unfortunately, as shown in FIG. 1e, after silicon nitride layer 114 and pad oxide layer 112 are patterned, a nitride residue 116 remains in gaps 110 which were formed in trench oxide 106 during the trench oxide strip step. It is to be noted that nitride residue 116 prevents oxidation of trench sidewalls wherever it is present.

As a result, as shown in FIG. 1e, a non-planar field oxide layer 118 is grown. Thin deep depressions 120 are created in field oxide 118 due to the retarded growth of the oxide layer at nitride residue locations 116. Depressions 120 can cause reliability problems in later processing steps. For example, polysilicon used to form collectors in bipolar circuits, or gate electrodes in CMOS circuits, can become trapped in depression 120 and cause shorts between adjacent lines. Another problem with the prior art process of forming a trench isolation structure is that the field oxidation layer 118 is grown above substrate 100 creating a non planar surface topography. That is, field oxide 118 and the top surface of substrate 100 are non planar. Such a non-planar surface topography adversely affects subsequent processing steps and is especially troublesome for photolithography definition of submicron lines used in the manufacture of ULSI circuits.

Thus, what is desired is a method of forming a reliable, deep trench isolation structure which has a planar surface topography and which can be used in the latest high density integrated circuits.

SUMMARY OF THE INVENTION

A novel method of forming a planar, high density, reliable isolation structure in a silicon substrate is described. First, a trench having a first depth and a first width is etched into the silicon substrate. The trench can be substantially anisotropically etched by reactive ion etching with a chemistry comprising HBr. A channel stop implant can be made at this time to form a channel stop region to help improve the isolation qualities of the structure. Next, a 200–600Å thick trench oxide layer is formed on the surface of the substrate and on the sidewalls and on the bottom of the trench. The trench oxide can be grown utilizing a chlorine chemistry. A conformal layer of polysilicon or amorphous silicon is deposited next onto the trench oxide layer. Polysilicon is formed on the trench oxide on the silicon substrate, and on the trench oxide in the trench. The polysilicon layer is deposited until the trench becomes substantially filled. The polysilicon or amorphous silicon layer can be formed by well-known chemical vapor techniques. Next, the polysilicon layer and the trench oxide layer on the surface of the substrate are removed. A silicon nitride layer is then formed on the surface of the substrate and on the refilled trench. Next, a masking layer is formed and patterned on the silicon nitride layer to define a location over the filled trench where a recess is to be formed. A recess having a second width which is greater than the first width and a second depth which is less than the first depth is etched at the defined location. The recess can be substantially anisotropically etched using a plasma etch with a chemistry comprising $C_2F_6$ and $O_2$. The recess is etched to a depth which is sufficient to remove all nitride at the defined location. Next, a field oxide layer is grown in the recess utilizing a chlorine chemistry. Field oxide is grown in the recess until the field oxide is substantially planar with the top surface of the silicon substrate. The silicon nitride layer on the substrate is then removed. Well-known process steps are then used to fabricate active devices and to interconnect them into functional circuits thereby completing the fabrication of an integrated circuit.

An object of the present invention is to provide a method of forming a reliable isolation structure which can provide excellent isolation without requiring substantial substrate area.

Another object of the present invention is to provide a deep trench isolation structure which exhibits a planar, depression free field oxide region.

Still yet another object of the present invention is to provide an isolation structure in a substrate wherein the substrate and the isolation structure together have a planar topography.

Still other objects and advantages of the present invention will become obvious from the detailed description which follows.

BRIEF DESCRIPTION OF THE DRAWINGS

FIG. 1b is an illustration of a cross-sectional view showing the formation of a polysilicon layer and a trench oxide layer on the substrate of FIG. 1a.

FIG. 3b is an illustration of a cross-sectional view showing the formation of a trench oxide layer and a polysilicon layer on the substrate and in the trench in the substrate of FIG. 3a.

DETAILED DESCRIPTION OF THE PRESENT INVENTION

The present invention discloses a novel, reliable, planar, trench isolation structure which is compatible with future ultra large scale integrated (ULSI) circuit fabrication requirements. In the following description, numerous specific details such as specific process steps, materials, and dimensions, are set forth in order to provide a thorough understanding of the present invention. It will be obvious, however, to one skilled in the art that the present invention may be practiced without these specific details. In other instances, well-known integrated circuit process steps and equipment have not been set forth in detail in order to not unnecessarily obscure the present invention.

Figure 2:
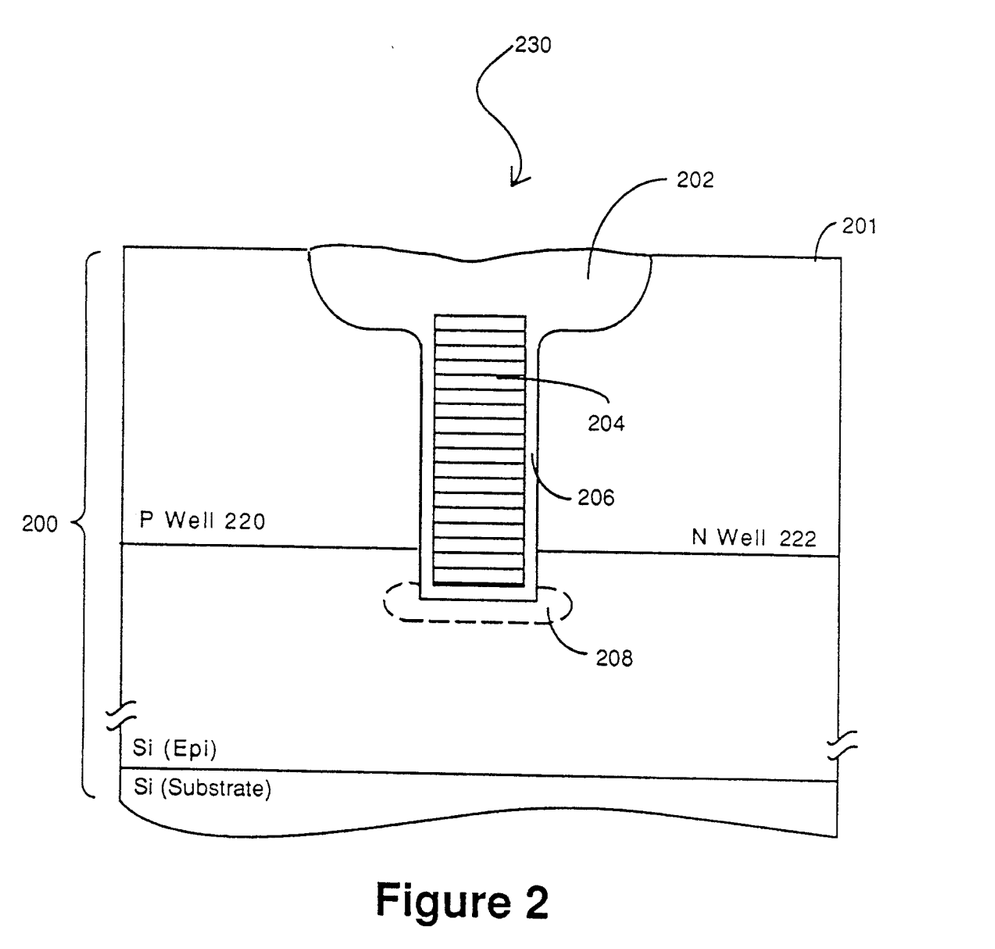
FIG. 2 is an illustration of a cross-sectional view of a deep trench isolation structure of the present invention wherein the field oxide is subsequently planar with the substrate.

A deep trench isolation structure of the present invention is shown in FIG. 2. The deep trench isolation structure 230 of the present invention comprises a field oxide 202 having a surface which is substantially planar with the surface 201 of silicon substrate 200 in which it is formed. A deep trench is filled void free with polysilicon 204 and trench oxide 206. A channel-stop implant region 208 can be provided to increase the isolation of qualities of the trench isolation structure. The deep trench isolation structure 230 of the present invention can be used to isolate p-wells 220 and n-wells 222 used in BiCMOS and CMOS integrated circuits. The deep trench isolation structure 230 provides adequate well isolation and prevents "latchup" without requiring excessive substrate area. This feature is especially beneficial for future ultra large-scale integrated (ULSI) circuits which will require high packing densities. The deep trench isolation structure 230 of the present invention can also be used for isolation in Bipolar integrated circuits. It is to be appreciated that, unlike the prior art technique, no depressions which can cause failures are formed in field oxide 202. Additionally, the planar surface topography of the isolation structure 230 aids in the fabrication of subsequent layers of a multilevel integrated circuit. It is to be appreciated that surface topography effects lithography definition and is therefor one of the most important criteria in the fabrication of future, high density, multilevel integrated circuits.

Figure 3A:
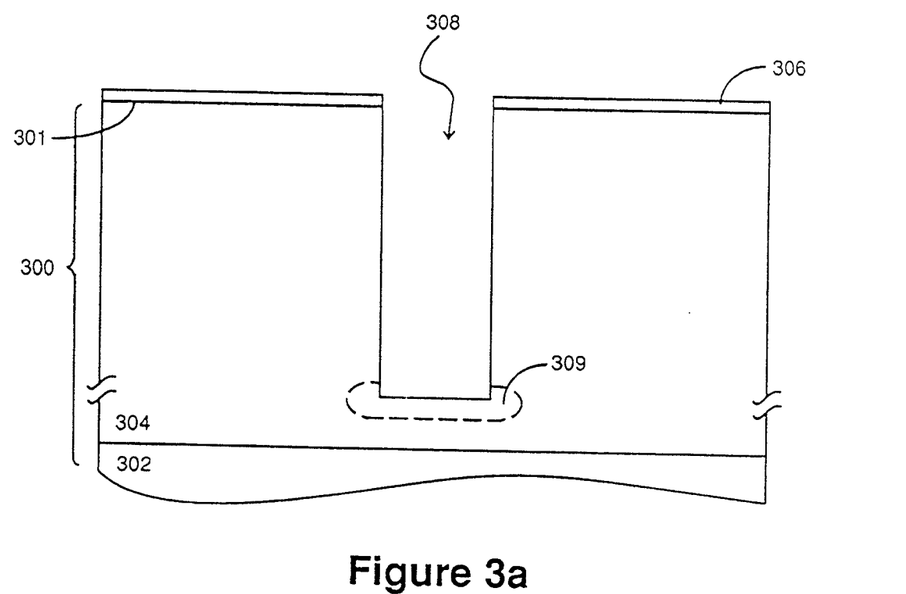
FIG. 3a is an illustration of a cross-sectional view showing the formation of a deep trench in a substrate.

In the fabrication of the planar, deep trench isolation structure of the present invention, a substrate 300, in which active devices of an integrated circuit are to be formed, is provided. For example, if a CMOS circuit is to be formed, a substrate 300 comprising a lightly doped single crystalline silicon layer 302 with an approximately 6 $\mu$m p-type epitaxial silicon layer formed upon it can be used, as shown in FIG. 3a. (It is to be appreciated that a variety of different types of silicon substrates, or even other types of semiconductor substrates, can be used in the present invention depending upon one's specific circuit requirements).

The first step in the fabrication of the planar isolation structure of the present invention is to form a deep trench 308 into substrate 300. In the fabrication of trench 308, a low temperature oxide (LTO) 306 is deposited over the top surface 301 of substrate 300. LTO layer 306 if then covered with a photoresist layer (not shown) which is masked, exposed, and developed with well-known techniques to define a location in LTO 306 where trench 308 is to be formed. The photoresist is then removed leaving patterned LTO layer 306 to provide a mask for the trench etch. Trench 308 is then anisotropically etched into the substrate 300 using a reactive ion etch (RIE) with a chemistry comprising HBr. A trench with an approximately 3 $\mu$m depth and a 0.8 micron width has been found to provide adequate isolation of n wells and p wells. (In order to provide adequate isolation in CMOS circuits, trench 308 should be formed to a depth which is deeper than the depth at which subsequent p wells and n wells will later be formed.) It is to be appreciated that trench 308 can be formed with sloped sidewalls, if desired, in order to improve sidewall coverage during Wench refill. Vertical sidewalls are preferred, however, in order to increase circuit packing density. A channel-stop implant 309 (i.e. a boron implant of substrate 300 at the bottom of trench 308) can be made at this time to improve the isolation qualities of the deep trench isolation structure. After trench 308 is formed, an HF dip can be used to remove LTO layer 306 from substrate 300 and to clear residue from the sidewalls of trench 308.

Figure 3B:
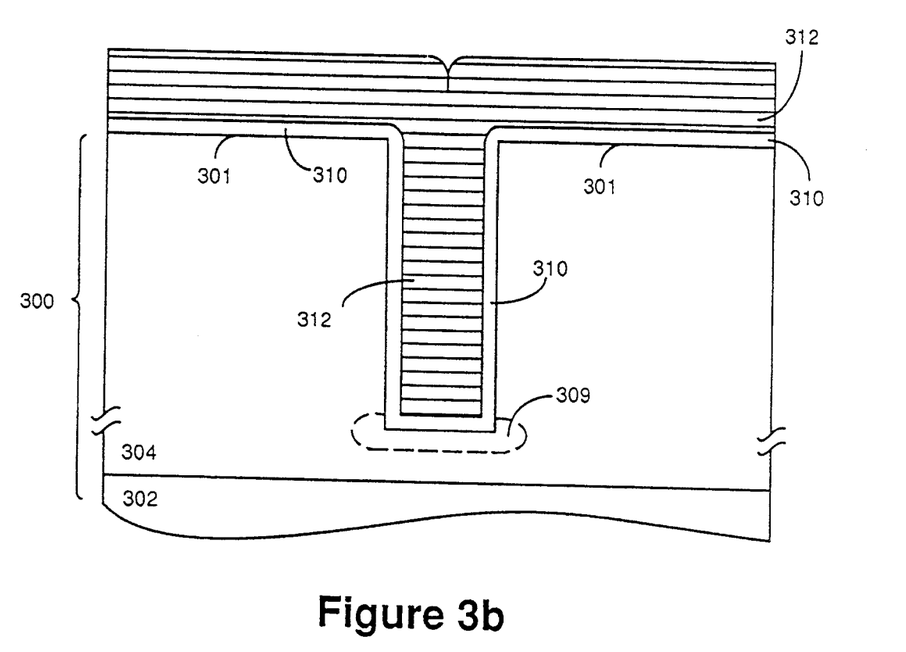

Next, as shown in FIG. 3b, trench 308 is refilled with a trench oxide and a polysilicon layer. First, a thin (approximately 200–600 Å) trench oxide layer 310 is grown on the surface 301 of substrate 300 and on the sidewalls and on the bottom of trench 308. Trench oxide 310 can be grown with well-known techniques such as oxidizing substrate 300 using chlorine chemistry (HCl). Next, a polysilicon layer 312 is blanket deposited onto trench oxide 310. Polysilicon 312 forms conformally on trench oxide 310 on substrate 300, and on trench oxide 310 on the sidewalls and on the bottom of the trench 308. Polysilicon 312 is deposited until trench 308 is completely filled with polysilicon to form refilled trench 313. Polysilicon layer 312 can be formed by chemical vapor deposition (CVD) utilizing well-known techniques. It is to be appreciated that polysilicon is used in the present invention to refill trench 308 because it forms conformally on trench sidewalls and fills trench 308 without forming voids. It is to be appreciated, however, that other materials, such as amorphous silicon or CVD $SiO_2$, may also be utilized. What is important is to select a material which can adequately refill trench 308 without forming voids. It is also to be appreciated that trench oxide layer 310 electrically isolates polysilicon (a conductor) from substrate 300. In this way conductive materials can be used to refill trench 308.

Figure 3C:
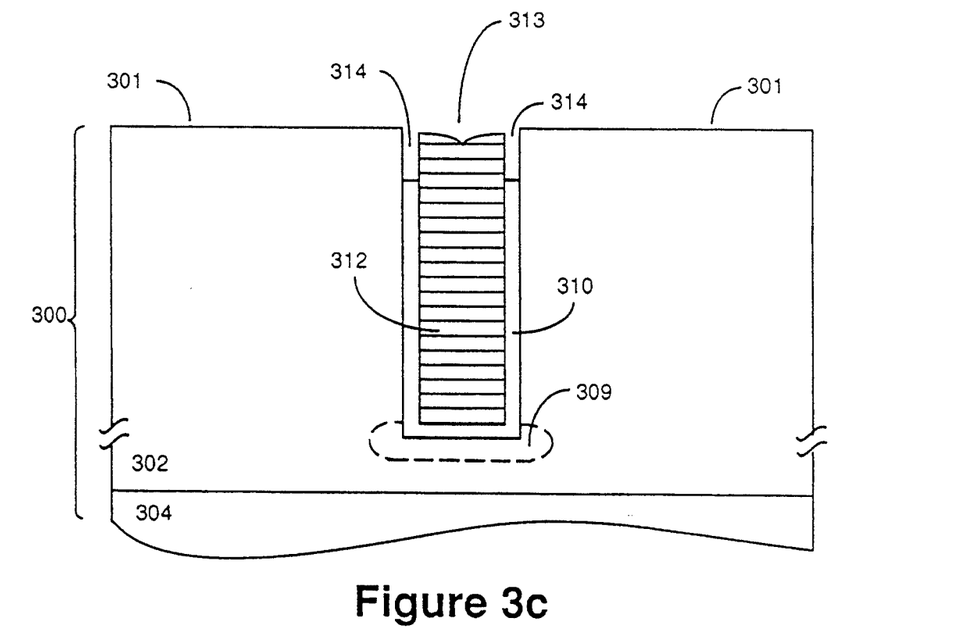
FIG. 3c is an illustration of a cross-sectional view showing the removal of the trench oxide and the polysilicon layer from the surface of the substrate of FIG. 3b.

Next, as shown in FIG. 3c, polysilicon layer 312 and trench oxide layer 310 formed on surface 301 of substrate 300 are removed. First polysilicon layer 312 is etched back with well-known techniques until trench oxide layer 3 10 is reached. A slight recessing of polysilicon layer 312 inside trench 308 may result. Next, trench oxide 310 formed on surface 301 of substrate 300 is stripped with an HF dip. During the HF dip, the top portion of trench oxide 3 10 inside trench 308 is etched away creating gaps 314 along the upper edges of refilled trench 313.

Figure 3D:
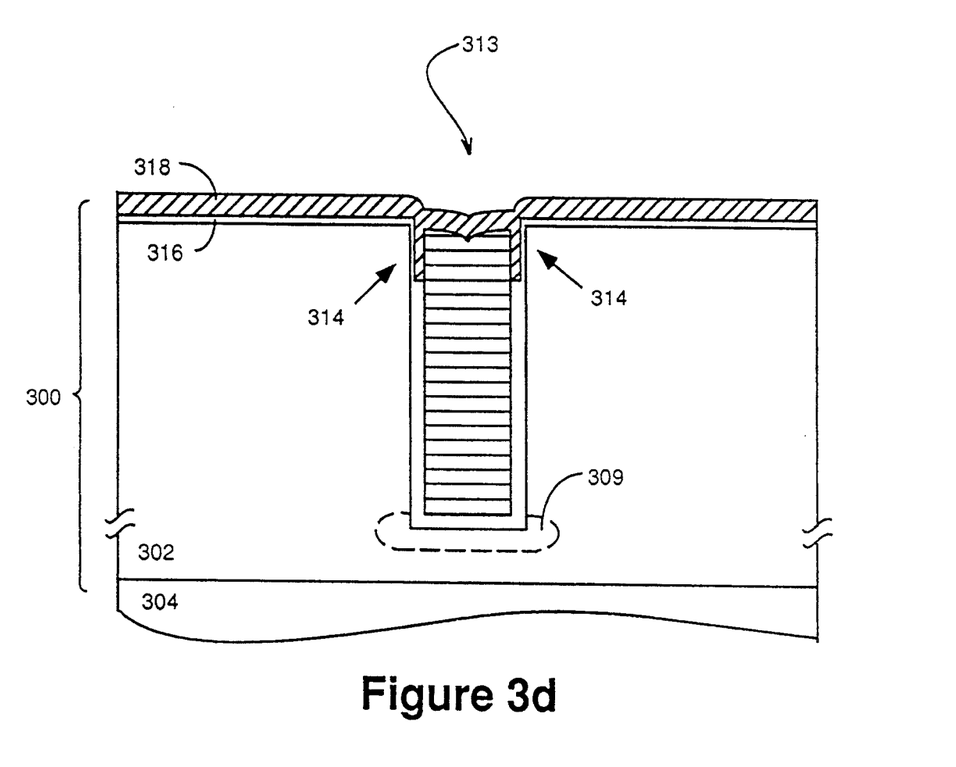
FIG. 3d is an illustration of a cross-sectional view showing the formation of a pad oxide layer and a silicon nitride layer on the substrate of FIG. 3c.

Next, as shown in FIG. 3d, a pad-oxide layer and a silicon nitride layer 318 are formed on substrate 300. Pad oxide layer 316 is optional and provides a "pad" or a "buffer" to cushion the transition of stress between silicon substrate 300 and subsequently deposited nitride layer 318. Pad oxide layer 316 can be thermally grown with well-known techniques onto substrate 300. Silicon nitride layer 318 can be deposited by well-known chemical deposition (CVD) techniques. It is to be noted that during deposition, silicon nitride forms in gaps 314 which were created during the trench oxide strip. As mentioned earlier, if prior art techniques for isolation are utilized, a nitride residue will remain in gaps 314 after standard nitride patterning, and cause the formation of deep depressions in a subsequently grown field oxide layer. It is to be appreciated that such deep depressions in the isolation regions can cause serious reliability problems in the fabricated integrated circuit.

Figure 3E:
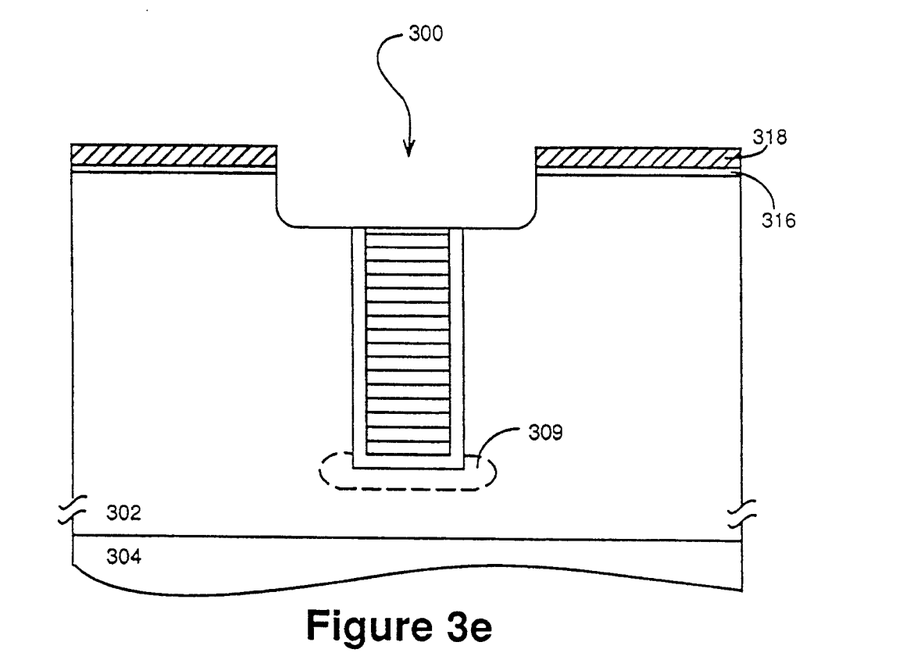
FIG. 3e is an illustration of a cross-sectional view showing the formation of a recess in the substrate of FIG. 3d.

Next, as shown in FIG. 3e, pad oxide layer 316 and silicon nitride layer 318 are patterned with well-known techniques to define the location where a field oxide region will be grown. During patterning, the anisotropic etch of silicon nitride layer 318 and pad oxide layer 316 is extended into silicon substrate 300 to form recessed area 320. Recess 320 removes the top portion of refilled trench 309. Although a wet etchant can be used in the present invention, a plasma etch with a chemistry comprising $C_2F_6$ and $O_2$ is preferred. Such an etchant can anisotropically etch silicon nitride layer 318, pad oxide layer 316, silicon substrate 300, trench oxide 310, and polysilicon 312. An anisotropic etch is preferred in order to provide a narrow isolation structure which can be utilized in a future high density integrated circuit. Recessed area 320 is formed to a depth in silicon substrate 300 which is sufficient to remove all silicon nitride residue which may have formed in gaps 314. The width of recessed area 320 is defined by isolation requirements and design rules of the specific circuit being manufacturing. Recessed area 322, however, is formed to a width which is at least as wide as trench 308 in order to remove all nitride residue.

Figure 3F:
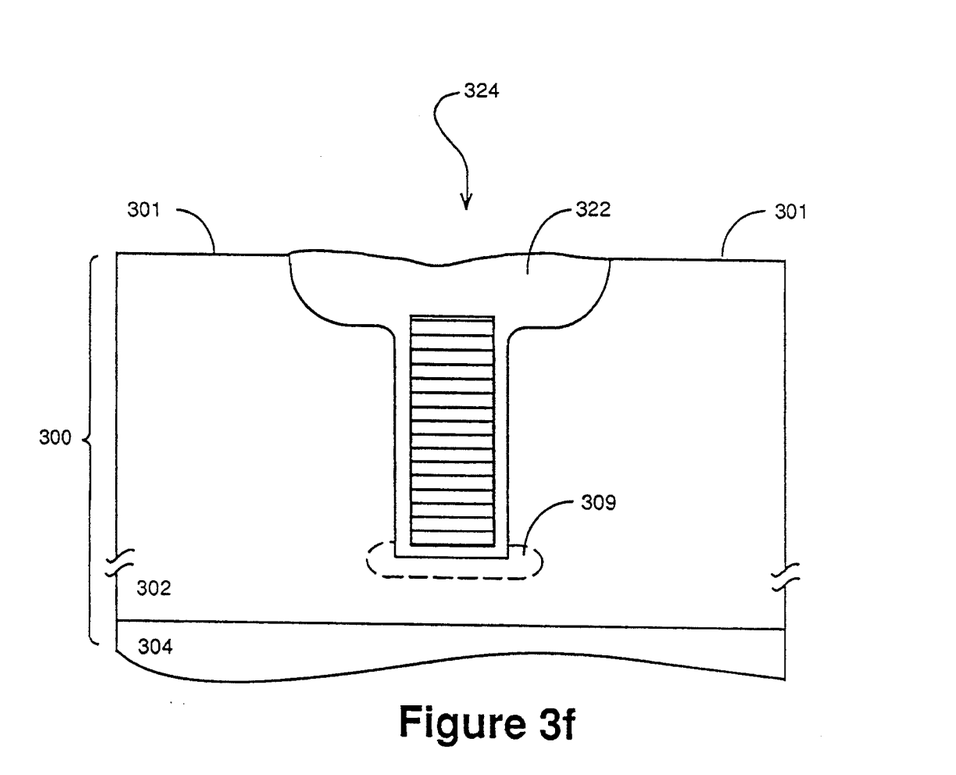
FIG. 3f is an illustration of a cross-sectional view showing the formation of a field oxide in the recess of the substrate of FIG. 3e.

Next, as shown in FIG. 3f, a field oxide 322 is grown in recess 320. Field oxide 322 is grown until the surface of field oxide 322 is substantially planar with surface 301 of substrate 300. It is to be appreciated that the depth of recess 300 is chosen so that a sufficiently thick oxide to provide the desired amount of isolation is grown when field oxide 322 is substantially planar with substrate 300. It is to be appreciated that approximately 50% of oxide growth is upward and 50% of oxide growth is downward into substrate 300. Thus, if a planar surface is desired, recess 320 should extend to at least a depth of approximately half the thickness of the desired field oxide thickness. After field oxide 322 is grown, pad oxide 316 and silicon nitride 318 are removed with well-known techniques. As can be seen in FIG. 3f, field oxide 322 and silicon substrate 300 are substantially planar. It is to be appreciated that it is highly desirable to start planarization of an integrated circuit at the substrate level and maintain a fully flat surface from thereon. Planar integrated circuit layers are essential in the manufacture of future high density multilevel integrated circuits.

The planar deep trench isolation structure 324 of the present invention is now complete. Well-known process steps can now be utilized to form and interconnect active devices in substrate 300. For example, epi layer 302 of substrate 300 may now be doped by well-known techniques to form n-wells and p-wells on each side of isolation structure 324. Active devices such as bipolar and MOS transistors can then be formed in the wells. The active devices would then be interconnected together by well-known techniques to form functional Bipolar, BiCMOS and CMOS integrated circuits to perform a variety of functions such as memories and microprocessors.

Thus, a novel, planar, high density, reliable, trench isolation structure and its method of fabrication have been described.

We claim:

1. A method of forming a trench and refilling said trench in a substrate comprising the steps of:
   etching a trench in said substrate wherein said trench has a first depth and a first width;
   filling said trench with a conformal material;
   etching a recess into said refilled trench wherein said recess has a second depth and a second width wherein said second depth is less than said first depth; and
   growing a thermal oxide in said recess until said thermal oxide is substantially planar with said substrate.

2. The method of claim 1 wherein said second width is greater than said first width.

3. The method of claim 1 wherein said trench is substantially anisotropic etched by reactive ion etching with a chemistry comprising HBr.

4. The method of claim 1 wherein said etching of said recess is a substantially anisotropic etched by plasma etching with a chemistry comprising $C_2F_6$ and $O_2$.

5. The method of claim 1 further comprising the step of forming a trench oxide on the sides and in the bottom of said trench before the step of filling said trench.

6. The method of claim 5 wherein said conformal material is selected from the group consisting of polysilicon and amorphous silicon and is formed by chemical vapor deposition.

7. A method of forming an isolation structure in a silicon substrate comprising the steps of:
   etching a trench having a first depth and first width into said substrate;
   forming a trench oxide layer on said substrate and on the sidewalls and on the bottom of said trench;
   forming a polysilicon layer on said trench oxide layer on said substrate and on said oxide layer on the sidewalls and on the bottom of said trench wherein said trench becomes filled;
   removing said polysilicon layer and said trench oxide layer from the surface of said substrate;
   forming a silicon nitride layer on said substrate and on said filled trench;
   forming and patterning a masking layer on said nitride layer to define a location over said filled trench where a recess will be formed;
   etching a recess at said location through said nitride layer, into said silicon substrate and said filled trench, wherein said recess is formed to a second depth and a second width, wherein said second depth is less than said first depth and said second width is greater than said first width; and
   forming a field oxide layer in said recess such that said field oxide layer in said recess is substantially planar with said substrate.

8. The method of claim 7 further comprising the step of forming a pad oxide layer on said silicon substrate prior to forming said silicon nitride layer.

9. The method of claim 7 further comprising the step of removing said patterned nitride layer after forming said field oxide layer.

10. The method of claim 7 further comprising the step of forming a channel stop region in the bottom of said trench after the step of etching said trench.

11. The method of claim 7 wherein said trench is substantially anisotropically etched by reactive ion etching with a plasma comprising HBr.

12. The method of claim 7 wherein said recess is substantially anisotropically etched by reactive ion etching with a chemistry comprising $C_2F_6$ and $O_2$.

13. The method of claim 7 wherein said trench oxide is grown utilizing chlorine chemistry.

14. The method of claim 13 wherein said trench oxide is grown to a thickness in the range of 200–600 Å.

15. The method of claim 7 wherein said second depth is a depth sufficient to remove any nitride residue remaining from said nitride layer.

* * * * *

UNITED STATES PATENT AND TRADEMARK OFFICE
CERTIFICATE OF CORRECTION

PATENT NO.    : 5,358,891
DATED         : October 25, 1994
INVENTOR(S)   : Tsang et al.

It is certified that error appears in the above-identified patent and that said Letters Patent is hereby corrected as shown below:

In column 4 at line 56 delete "Wench" and insert --trench--

Signed and Sealed this

Thirty-first Day of December, 1996

Attest:

BRUCE LEHMAN

*Attesting Officer*  *Commissioner of Patents and Trademarks*